United States Patent [19]

Eltzroth et al.

[11] 3,718,272

[45] Feb. 27, 1973

[54] BONDING TIP

[75] Inventors: Richard E. Eltzroth; Larry K. Fewell, both of Kokomo, Ind.

[73] Assignee: General Motors Corporation, Detroit, Mich.

[22] Filed: May 1, 1972

[21] Appl. No.: 249,399

Related U.S. Application Data

[62] Division of Ser. No. 36,323, May 11, 1970, Pat. No. 3,689,983.

[52] U.S. Cl. ..............................228/3, 228/1, 228/44

[51] Int. Cl.............................B23k 21/00, B23p 3/02

[58] Field of Search....................228/1, 3, 4, 5, 15, 44

[56] References Cited

UNITED STATES PATENTS

| | | | |
|---|---|---|---|
| 3,347,442 | 10/1967 | Reber | 228/44 X |
| 3,593,906 | 7/1971 | Hug | 228/1 |
| 3,610,506 | 10/1971 | Robinson | 228/1 |
| 3,623,649 | 11/1971 | Keisling | 228/3 X |
| 3,627,192 | 12/1971 | Killingsworth | 228/3 X |
| 3,648,354 | 3/1972 | Mashino et al. | 228/3 X |

*Primary Examiner*—J. Spencer Overholser
*Assistant Examiner*—Richard B. Lazarus
*Attorney*—William S. Pettigrew et al.

[57] ABSTRACT

A bonding tip and method is disclosed for making an extremely strong tailless wire bond on a contact pad of a semiconductor device without significantly reducing the connected unbonded wire cross-section immediately adjacent the bond. One form of the tool includes an elongated member having a flat bonding surface on one end and a pair of oppositely disposed grooves which intersect opposite edges of said bonding surface. The connected unbonded wire adjacent a final bond of an interconnection is aligned with one of the grooves and separated from the bonded portion while the tip is in pressing engagement therewith by pulling thereby removing a preselected part of the bond under a groove producing a tailless bond.

3 Claims, 5 Drawing Figures

BONDING TIP

This application is a division of U.S. patent application Ser. No. 36,323 entitled "Bonding Tip", filed May 11, 1970 now U.S. Pat. No. 3,689,983, in the names of Richard E. Eltzroth and Larry K. Fewell, and assigned to the assignee of this application.

This invention relates to a bonding tool and more particularly to a wedge-type bonding tip for bonding filamentary wires between preselected parts of a semiconductor device.

Semiconductor devices, such as a hybrid thick film integrated circuit, a monolithic integrated circuit, or the like, normally have contact pads thereon interconnected by filamentary wire. The overall reliability of these circuits can be improved if one increases the reliability of these interconnections. It has been found that failures often occur in such interconnections as a result of inadequate wire bonds and/or excessive wire necking adjacent thereto. Necking, as herein referred to, describes an abrupt and often severe restriction or reduction in the normal wire cross-sectional area. Besides the failure attributable to mechanical breakage thereat, these restrictions also reduce the current carrying capacity of a wire. Moreover, a hot spot also can develop at such a reduced wire cross section which can weaken it even more, increasing the likelihood of failure there.

One method of minimizing necking is to use ball bonding techniques. In this method, the end of the thread-like wire is first fused by a jet of flame. The fused end is then allowed to solidify and as it does, it beads in the form of a ball. The ball shaped end would then be bonded to a contact pad. However, ball bonds do not have the requisite adhesive strength required for many applications. One method of increasing the adhesive strength of a wire bond on a contact pad is to increase the area of the wire-contact pad interface. This normally means that the filamentary wire, which is typically aluminum and of circular cross-section, must be shaped into an elongated thin cross-section herein referred to as a wedge-type bond. However, the thinner one makes a bond, the more one increases the likelihood of necking in the region adjacent the flattened area of a bond.

In order to make a wedge-type bond, bonding pressure must normally be exerted against the wire on the contact pad. However, the contact pad is often on a frangible oxide coating and excessive bonding pressure should be avoided. It would be desirable if a softer and more ductile wire, such as an annealed gold, could be used in certain applications. Not only could this reduce the required bonding pressure, but such an annealed gold wire would be less likely to fracture from work hardening due to in-service temperature variations. Moreover, gold wire has a higher conductivity and consequently can safely carry a higher current for a given cross-sectional area. However, the use of extremely soft wire, such as gold, often causes even more aggravated necking when certain prior art bonding devices are used.

Furthermore, the wire segment intermediate the two wire bonds is generally stretched somewhat as the wire is moved from a position overlying the first bond to a similar position with respect to the next bond. This can also aggravate the necking adjacent the first bond. It is generally practical, particularly in high volume commercial production, that the interconnections be formed from wire led from a reel rather than be a precut length. Therefore, the reel wire is separated from the interconnection after the final bond is made. If this separation does not occur immediately adjacent the bond, a troublesome wire tag end is left. It is desirable, particularly if one is to increase the area of the wire-contact pad interface, to provide a simple means of eliminating this tag end, especially with complex integrated circuits. Indeed, the closer the contact pads, the more likely this tag end can short circuit adjacent contact pads and thereby decrease the reliability of an interconnection even more.

Accordingly, an object of this invention is to provide an improved bonding tip for increasing the reliability of wire interconnections made between preselected contact pads of a semiconductor device.

Another object of this invention is to provide a bonding tip for producing wedge-type bonds on contact pads wherein necking adjacent thereto is substantially decreased.

Still another object of this invention is to provide a method for making wire bonded interconnections between contact pads of a semiconductor device without producing significant necking therein and from which the tag end may be simply eliminated.

In accordance with one aspect of this invention, an elongated member has a flat bonding surface and a pair of oppositely disposed grooves which intersect opposite edges of the bonding surface. Wire feed means generally align the connected unbonded wire with an adjacent groove so that it can be separated from the bond by pulling thereby removing a preselected portion of this bond eliminating any tag end while the bonding surface is in pressing engagement with the bond on the contact pad.

Other objects, features and advantages of this invention will become more apparent from the following description of the preferred example and from the drawings in which.

Figures 1, 2:
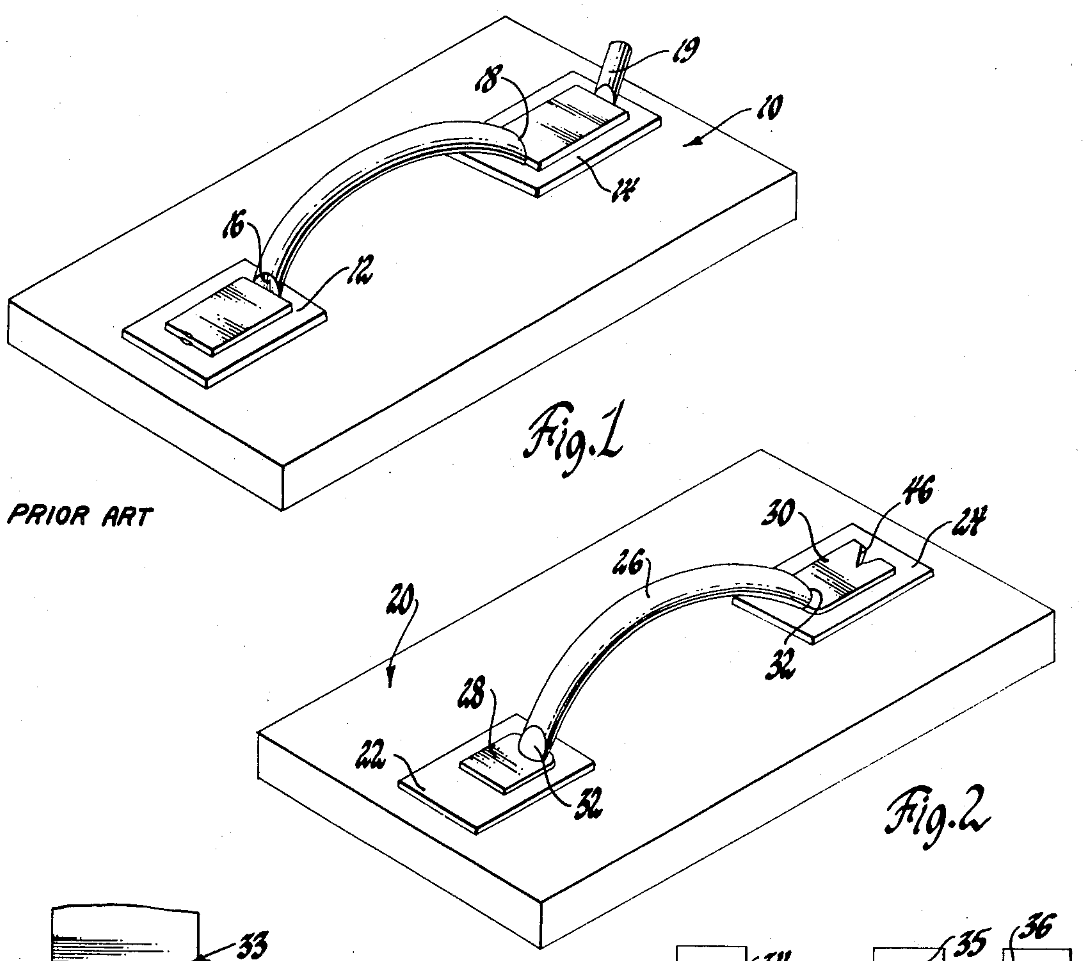
FIG. 1, FIG. 2 PRIOR ART
FIG. 1 is an illustration of an interconnection made in accordance with a prior art bonding device.
FIG. 2 is an illustration of an interconnection made in accordance with this invention.

Referring now to the figures, FIG. 1 shows a device 10 having a pair of contact pads 12 and 14 connected by a wire interconnection made with a prior art bonding device. The wire adjacent to either bond is characterized by a severely reduced cross section labelled 16 and 18 respectively, whereat failure can readily occur. Moreover, a tag end 19 is attached to the bond on contact pad 14.

On the other hand, FIG. 2 shows a semiconductor device 20 having a pair of spaced apart aluminum contact pads designated 22 and 24, respectively interconnected by a wire segment designated by numeral 26. Interconnection 26, which is 1.5 mil wire of circular cross-section, had wedge-type bonded ends 28 and 30 on contact pads 22 and 24, respectively. It should be noted that the region of wire segment 26 adjacent each of the flat wedge-type bonds is characterized by only a slight distortion from the normal wire cross sectional area. This region is designated by numeral 32.

It should also be noted that a semiconductor device, such as device 20, can have several contact pads. In fact, the device could be an integrated circuit having numerous contact pads. However, only two pads are shown and interconnected to facilitate explanation. Typically, these contact pads can have dimensions of about 5 × 5 mils spaced from each other by less than 3 mils. It should further be noted that, as herein described, a flat wedge-type bond is one which has a thickness of less than about 20 percent of its original diameter. Wire bonds 28 and 30 have a thickness of about 0.20 mils.

Figure 3:
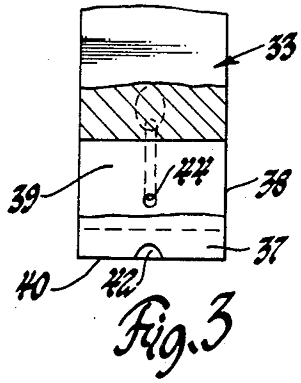
FIG. 3 is a partially broken away fragmentary front view of a tool fabricated in accordance with this invention.
Figure 4:
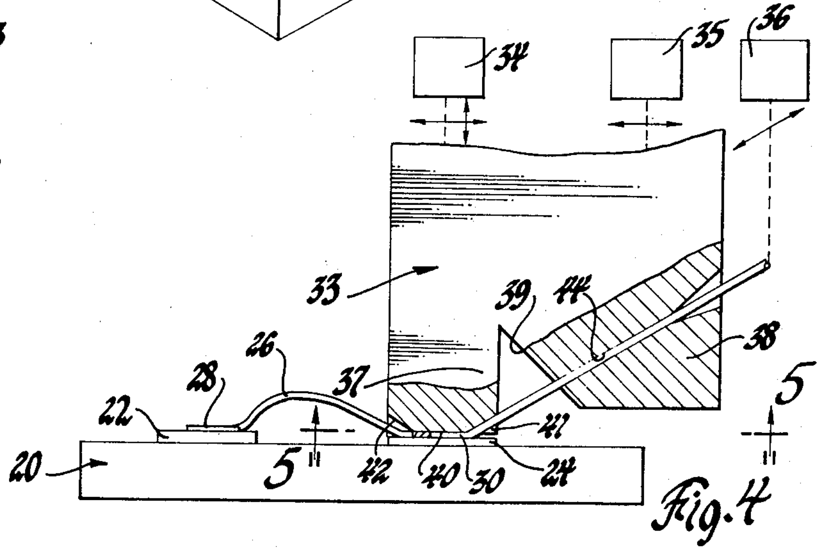
FIG. 4 depicts a partially broken away fragmentary side view of a tool made in accordance with this invention making an interconnection according to this invention.
Figure 5:
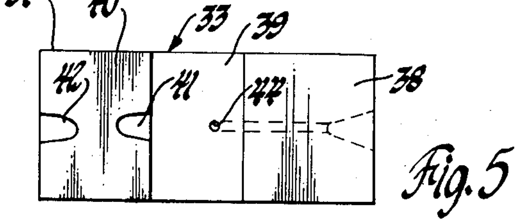
FIG. 5 is a view taken along lines 5—5 of FIG. 4.

Referring now generally to a bonding tip according to this invention, FIGS. 3–5 depict an elongated tungsten carbide bonding tip designated by numeral 33. Blocks 34, 35 and 36 represent conventional apparatus for performing pressure type ultrasonic bonds. More specifically, block 34 represents apparatus for moving the tip from one contact pad to another and into pressing engagement with a contact pad. Block 35 represents apparatus for ultrasonically vibrating the tip, while block 36 represents apparatus for engaging the wire for either feeding it toward the bonding surface or pulling therefrom. Continuing, tool 33 includes a bonding step 37 and wire receiving step 38 both on the lower portion of the tip and spaced from each other by a notch section 39. Bonding step 37 has a flat bonding surface 40 on its end as well as a pair of oppositely disposed grooves designated 41 and 42, with groove 41 being adjacent notch 39. Step 38 provides the wire feed and alignment means for the tip in the form of a wire receiving channel 44 therethrough. Channel 44, which is coaxial with groove 41 and includes an upper funnel-shaped entrance facilitating insertion of the filamentary wire, terminates at notch 39. It should be noted that the end surface of step 38 is raised from bonding surface 40 to avoid inadvertent engagement with the semiconductor device.

Referring now to pertinent dimensions and relationships of the tip, the flat bonding surface has a rectangle outline of 5.5 × 4.5 mils. The pair of oppositely disposed grooves are equally spaced from opposing transverse edges and extend from opposing longitudinal edges of the surface inwardly toward each other about 1.5 mils. The depth of each groove is 1.5 mils at the longitudinal edges of the surface, while their depth linearly decreases therefrom toward the center of the bonding surface. Each groove is at an angle of 45° with the bonding surface. The radius of curvature of each groove is 0.75 mils, while the distance across the flat bonding surface between the grooves is 1.5 mils. On the other hand, the lower part of the channel is about 2.0 mils in diameter.

It has been found that such relationships allow the gold wire to transform, or grow, out of a flat wedge-type bond without appreciable necking in the interconnection adjacent thereto. Accordingly, while these relationships are generally preferred, other dimensions can provide acceptable results. For example, although a groove angle of 45° is preferred, acceptable results can be obtained with a groove angle of about 30°–60°. A groove angle of less than about 30° can produce excessive necking adjacent the bond. On the other hand, a groove angle of more than about 60° can make it difficult to achieve a strong wedge-type bond.

As mentioned previously, a groove radius of curvature which is approximately equal to that of the preselected wire is preferred. However, acceptable results can be accomplished with a radius of curvature between about 0.75 and about 1.5 that of the wire. The wire can be difficult to control in a groove with a radius of curvature of more than about 1.5 times the wire. A groove radius of curvature of less than about 0.75 can cause excessive necking in the wire when the bonding surface is in pressing engagement therewith as will be explained.

While the spacing between the grooves has been described as being about equal to the wire diameter, which spacing is preferred for the described embodiment, other groove spacings can be acceptable. However, where the spacing is more than about 2.0 times the wire diameter, the ultimate wire bond size can be difficult to control on the contact pad. A spacing of less than about 0.5 times the wire diameter can result in a markedly weaker bond.

Finally, it has been found that the groove depth at the edge of the bonding tip should be at least about 0.5 times the wire diameter. A depth less than about 0.5 times the wire diameter can create too abrupt a restriction in an interconnection. Further, it has been found that it is decidely more difficult to coaxially align the wire in a groove which has a depth of more than about 1.5 times that of a groove.

A method of making the interconnection generally shown in FIG. 2 will now be described. As is well known, the ultrasonic frequency used in a pressure bonding process of this type lies generally between about 10,000–100,000 cycles per second. Moreover, the pressing force required in this type of bonding operation also varies within a given range depending upon the particular characteristics of the wire used which are all well known. Accordingly, they need not be discussed here.

Continuing, wire from a reel, not shown, can be fed into the funnel-shaped entrance of channel 44 by apparatus 36 and led therethrough until its free end is under the bonding surface of the tool. The tip and wire would then be positioned to overlie a first preselected area, such as contact pad 22, by apparatus represented by block 34. The free end portion of the source wire would then be located under that part of the flat bonding surface intermediate the grooves and the groove adjacent the channel of step 38. Alternately, the tip can be positioned over the pad first and the wire subsequently led through the channel.

In order to form a first wire bond onto contact pad 22, the bonding surface would be brought into pressing engagement with the free end portion of the soft gold wire on the contact pad. The portion of the wire intermediate the grooves would be flattened while the portion under the adjacent groove would not be significantly extruded. The tip would then be rapidly vibrated generally parallel to the plane of the contact pad to complete the bond herein designated wedge-type bond 28 by apparatus represented by block 35. The elongated tool would then be moved upwardly and laterally to a position over a second preselected area, such as contact pad 24. As the tool is moved to pad 24, a sufficient amount of the filamentary wire is allowed to freely pass through the channel forming the looped portion of the interconnection. Invariably, the wire led out has a tendency to stretch which could further aggravate necking adjacent the bond on pad 22. However, the necking as herein described is insignificant. Accordingly, the wire tends to elongate or stretch uniformly over its entire length.

A portion of the wire is positioned onto pad 24 and the flat bonding surface and both of the grooves would then be brought into pressing engagement therewith on contact pad 24. A second bond, herein designated by numeral 30, can be made in a similar manner completing the interconnection. Again, that portion of the wire intermediate the grooves is flattened, while that portion underlying the grooves would not be significantly extruded. In fact, the wire in the grooves adjacent the edge of the bonding surface would not be compressed at all. Accordingly, little if any necking occurs. In fact, it has been found that the bonds may be flattened to slightly less than 10 percent of the original wire diameter without significant necking.

The unbonded wire may be separated from the interconnection leaving a tailless bond by a method now to be described. While the tip remains in pressing engagement with bond 30, or the final bond of an interconnection, the unbonded wire can be pulled along channel 44 and groove 41. It has been found that the separation occurs generally within a portion of the bond underlying the groove area. Accordingly, a portion designated 46 of the bond 30 is thus removed, providing a tailless bond.

What is claimed is as follows:

1. A pressure bonding tip for producing an extremely strong wedge-type wire bond on a contact pad of a semiconductor device without producing significant necking between the bonded and connected unbonded portion of a wire of substantially circular cross-section, said bonding tip comprising an elongated member, a flat bonding surface on one end of said member for compressing a portion of said wire against said semiconductor device contact pad and bonding it thereto, said member having first and second spaced apart grooves each of which being semicircular-like in cross-section, said grooves extending inwardly toward one another from opposing sides of said member at said one end and intersecting opposite edges of said bonding surface, each of said grooves being at an angle of about 30°–60° with said surface, the depth of each of said grooves at the edge of said bonding surface being about 0.5–1.5 times the diameter of said wire, and means adjacent said first groove for guiding said wire under said flat bonding surface and for maintaining the unbonded portion of the wire adjacent the bonded portion generally coaxially aligned with said first groove.

2. A pressure bonding tip for producing an extremely strong tailless wedge-type wire bond on a contact pad of a conductor device without producing significant necking between the bonded and connected unbonded portion of a wire of substantially circular cross-section, said bonding tip comprising an elongated member, a flat bonding surface on one end of said member for compressing a portion of said wire against said semiconductor device contact pad and bonding it thereto, said member having first and second spaced apart grooves each of which being semicircular-like in cross-section, said grooves extending inwardly toward one another from opposing sides thereof at said one end and intersecting opposite edges of said bonding surface, each of said grooves being at an angle of about 30°–60 with said surface, the depth of each of said grooves at the edge of said bonding surface being about 0.75–1.25 times the diameter of said wire and the radius of curvature of each of said grooves being about 0.75–1.5 times the diameter of said wire, and means adjacent said first groove for guiding said wire under said flat bonding surface and for maintaining an unbonded portion of said wire adjacent the bond generally coaxially aligned with said first groove while said flat bonding surface is in pressing engagement with the wire on the contact pad so that a tailless bond can be produced by pulling the connected unbonded portion of the wire coaxially with said first groove to remove a preselected edge section of the bonded portion while it is compressed against the contact pad by said bonding surface.

3. A bonding tip of tungsten carbide for pressure bonding a preselected diameter of gold wire producing an extremely strong tailless wedge-type bond on a contact pad of an integrated circuit without producing significant necking between the bonded and connected unbonded portion of the wire, said bonding tip comprising an elongated member, a bonding step portion on one end of said member, a wire guide step portion on said one end of said member adjacent said bonding step portion, a flat bonding surface on said bonding step portion for compressing a portion of the wire against an integrated circuit contact pad and bonding it thereto, said bonding step portion having first and second semicircular-like grooves spaced from each other about 1.0 times the wire diameter, said grooves extending inwardly toward one another from opposite sides of said bonding step portion intersecting opposite edges of said bonding surface at an angle of about 45°, the depth of each of said grooves at the edge of said bonding surface being about equal to the diameter of the wire and the radius of curvature of each of said grooves being about equal to that of the wire, said wire guide portion having a channel therethrough, said channel being generally coaxial with said first groove and terminating adjacent thereto for guiding the preselected wire under said bonding surface and for maintaining the connected unbonded wire in said first groove when the flat bonding surface is in pressing engagement with the wire on the contact pad so that a tailless bond can be provided by pulling the connected unbonded portion of the wire coaxially along said channel to remove a preselected edge region of said bonded portion while it is still in contact with said bonding surface.

* * * * *